(12) United States Patent
Wang et al.

(10) Patent No.: US 10,304,803 B2
(45) Date of Patent: May 28, 2019

(54) NANOSCALE INTERCONNECT ARRAY FOR STACKED DIES

(71) Applicant: Invensas Corporation, San Jose, CA (US)

(72) Inventors: Liang Wang, Milpitas, CA (US); Bongsub Lee, Mountain View, CA (US); Belgacem Haba, Saratoga, CA (US); Sangil Lee, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/147,807

(22) Filed: May 5, 2016

(65) Prior Publication Data

US 2017/0323867 A1    Nov. 9, 2017

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/11* (2013.01); *H01L 24/17* (2013.01); *H01L 24/27* (2013.01); *H01L 24/32* (2013.01); *H01L 24/73* (2013.01); *H01L 24/81* (2013.01); *H01L 24/83* (2013.01); *H01L 24/92* (2013.01); *H01L 25/50* (2013.01); *H01L 2224/1145* (2013.01); *H01L 2224/11426* (2013.01); *H01L 2224/11452* (2013.01); *H01L 2224/11462* (2013.01); *H01L 2224/11464* (2013.01); *H01L 2224/13111* (2013.01); *H01L 2224/13147* (2013.01); *H01L 2224/13155* (2013.01); *H01L 2224/16112* (2013.01); *H01L 2224/16145* (2013.01); *H01L 2224/27003* (2013.01); *H01L 2224/2761* (2013.01); *H01L 2224/2783* (2013.01); *H01L 2224/27618* (2013.01); *H01L 2224/2919* (2013.01); *H01L 2224/32145* (2013.01); *H01L 2224/73204* (2013.01);
(Continued)

(58) Field of Classification Search
CPC .......... H01L 21/76897; H01L 2224/82; H01L 23/5226; H01L 25/0657; H01L 21/76877; H01L 24/32
See application file for complete search history.

(56) References Cited

U.S. PATENT DOCUMENTS 6,340,822 B1 *  1/2002  Brown .............. H01L 23/49811
                                            257/25
7,659,624 B2 *  2/2010  Mayya Kolake ..... H01L 21/288
                                            257/288

(Continued)

OTHER PUBLICATIONS

International Search Report and Written Opinion for PCT Application No. PCT/US2017/029881, dated Jul. 31, 2017, 15 pages.
(Continued)

*Primary Examiner* — Khiem D Nguyen

(57) ABSTRACT

A microelectronic assembly including an insulating layer having a plurality of nanoscale conductors disposed in a nanoscale pitch array therein and a pair of microelectronic elements is provided. The nanoscale conductors can form electrical interconnections between contacts of the microelectronic elements while the insulating layer can mechanically couple the microelectronic elements together.

12 Claims, 12 Drawing Sheets

A)

B)

(52) U.S. Cl.
CPC ............... *H01L 2224/8385* (2013.01); *H01L 2224/9211* (2013.01); *H01L 2225/06513* (2013.01); *H01L 2924/01013* (2013.01); *H01L 2924/01022* (2013.01); *H01L 2924/01024* (2013.01); *H01L 2924/01079* (2013.01); *H01L 2924/0615* (2013.01); *H01L 2924/0635* (2013.01); *H01L 2924/0645* (2013.01)

(56) References Cited

U.S. PATENT DOCUMENTS

| | | | |
|---|---|---|---|
| 9,583,389 B2* | 2/2017 | Romero | H01L 21/76838 |
| 2005/0191842 A1 | 9/2005 | Aggarwal et al. | |
| 2005/0257821 A1* | 11/2005 | Ramanathan | H01L 23/38 |
| | | | 136/203 |
| 2008/0054482 A1* | 3/2008 | Audet | H01L 23/49827 |
| | | | 257/774 |
| 2010/0047971 A1* | 2/2010 | Hua | H01L 21/4846 |
| | | | 438/122 |
| 2012/0007132 A1* | 1/2012 | Chang | H01L 21/486 |
| | | | 257/99 |
| 2012/0153454 A1* | 6/2012 | Liu | H01L 23/38 |
| | | | 257/712 |
| 2013/0189492 A1 | 7/2013 | Millward et al. | |
| 2015/0228475 A1 | 8/2015 | Ban et al. | |
| 2016/0118260 A1* | 4/2016 | Mebarki | H01L 21/28556 |
| | | | 438/660 |
| 2017/0166784 A1* | 6/2017 | Hedrick | H01L 25/50 |

OTHER PUBLICATIONS

Maxfield, Clive, "2D vs. 2.5D vs. 3D ICs 101," EE Times—web article, http://www.eetimes.com/document.asp?doc_id=1279540, Apr. 8, 2012, 9 pages.

* cited by examiner

NANOSCALE INTERCONNECT ARRAY FOR STACKED DIES

FIELD

The following description relates to integrated circuits ("ICs"). More particularly, the following description relates to an array of nanoscale conductors disposed in an insulating layer and electrically interconnecting stacked IC dies.

BACKGROUND

Microelectronic elements often comprise a thin slab of a semiconductor material, such as silicon or gallium arsenide, commonly called a semiconductor chip or die. Dies are commonly provided as individual, prepackaged units. In some unit designs, the die is mounted to a substrate or a chip carrier, which is in turn mounted on a circuit panel, such as a printed circuit board (PCB).

Active circuitry is often fabricated on a first face of the die (e.g., a front surface). To facilitate electrical connection to the active circuitry, the die is provided with bond pads on the same face. The bond pads are typically placed in a regular array either around the edges of the die or, for many memory devices, in the die center. The bond pads are generally made of a conductive metal, such as copper or aluminum, and can be about 0.5 micron (μm) thick. The bond pads can include a single layer or multiple layers of metal. The size of the bond pads can vary with the device type, but often measure tens to hundreds of microns on a side.

Microelectronic elements such as semiconductor dies typically require many input and output connections to other electronic components. The input and output contacts of a die or other comparable device are generally disposed in grid-like patterns that substantially cover a surface of the die (commonly referred to as an "area array") or in elongated rows which may extend parallel to and adjacent to each edge of the die's front surface, or in the center of the front surface. Dies can be provided in packages that facilitate handling of the die during manufacture and during mounting of the die on an external substrate such as a circuit board or other circuit panel. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls that are typically between about 0.1 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Packaged semiconductor dies are often provided in "stacked" arrangements, wherein one package is provided, for example, on a circuit board or other carrier, and another package is mounted on top of the first package. These arrangements can allow a number of different dies to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

There can be a variety of challenges to implementing stacked die arrangements. For example, consistent die placement accuracy can be challenging, including the difficulties of aligning terminals between dies. This can be further complicated when a pitch of the interconnection terminals of the dies becomes more and more fine.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
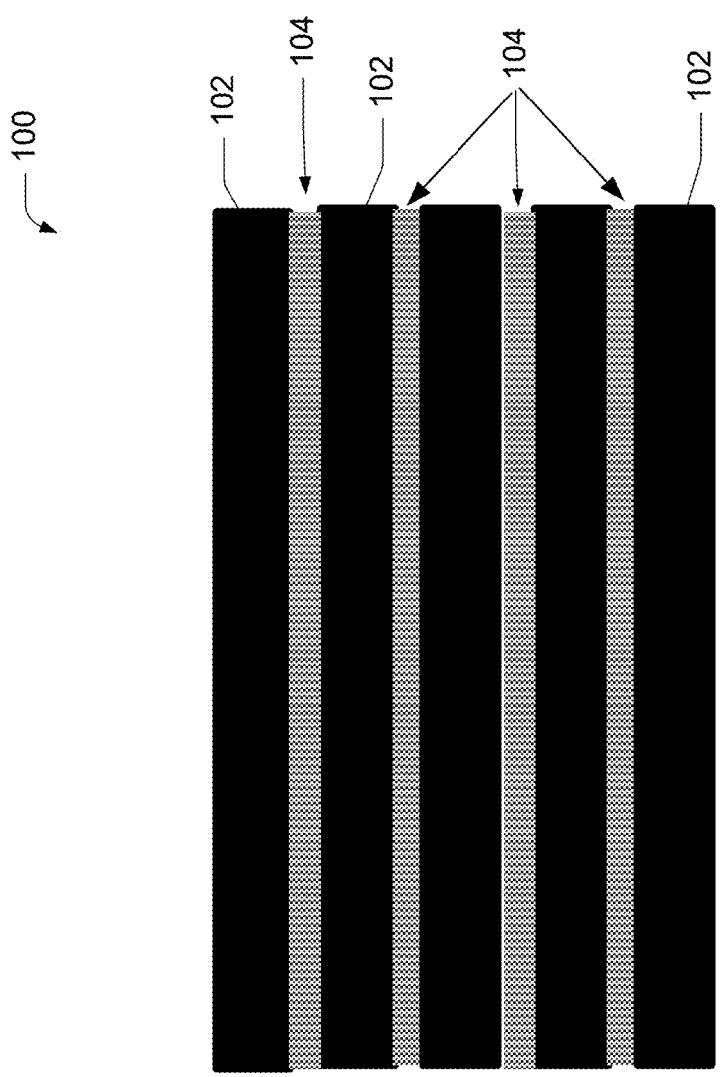
FIG. 1 is an illustration of a three-dimensional stack of dies having an interconnect array between adjacent dies of the stack, according to an implementation.

A microelectronic assembly is disclosed, comprising an insulating layer having a plurality of nanoscale conductors (e.g., conductive nanowires) disposed therein, and a three-dimensional stack of at least a pair of microelectronic elements. The nanoscale conductors can form electrical interconnections between terminals and contacts of adjacent microelectronic elements of the stack, while the insulating layer can mechanically couple the adjacent microelectronic elements together.

In various implementations, the nanoscale conductors are arranged in an array with a nanoscale pitch. The fine pitch allows the nanoscale conductors to make contact with terminals having a variety of shapes, sizes, patterns, and layouts, on many different types of microelectronic elements. Accordingly, the nanoscale interconnect array can be a universal interconnection layer, which may be applied to interconnect many different microelectronic elements without regard for contact patterns or the need for painstaking alignment between the interconnection layer and the contacts of the microelectronic elements.

One aspect of the disclosure provides a microelectronic assembly, including: an insulating layer having a first surface and a second surface opposite the first surface and a plurality of nanoscale conductors disposed in an array within the insulating layer. The plurality of nanoscale conductors extend from the first surface to the second surface of the insulating layer, and the array has a nanoscale pitch. In some embodiments, the nanoscale conductors are arranged normal to the first and second surfaces of the insulating layer, or similarly arranged, to minimize the length of the nanoscale conductors.

An included first microelectronic element has a first face and a plurality of first element contacts at the first face, the first element contacts facing and joined to the plurality of nanoscale conductors at the first surface of the insulating layer. An included second microelectronic element has a second face and a plurality of second element contacts at the second face, the second element contacts facing and joined to the plurality of nanoscale conductors at the second surface of the insulating layer. In the implementation, the plurality of nanoscale conductors form electrical interconnections between first element contacts of the first microelectronic element and second element contacts of the second microelectronic element.

In an embodiment, the insulating layer comprises an adhesive polymer mechanically coupling the first microelectronic element to the second microelectronic element while the plurality of nanoscale conductors electrically couples element contacts of the first microelectronic element to element contacts of the second microelectronic element.

In another embodiment, there are more than two microelectronic elements in the stack. The above mentioned insulating layer is a first insulating layer, and the microelectronic assembly further comprises a second insulating layer extending from the second microelectronic element at a face opposite the second face, to a third face of a third microelectronic element. In the embodiment, the second insulating layer includes a second plurality of nanoscale conductors disposed in a nanoscale pitch array within the second insulating layer, the second plurality of nanoscale conductors extending to the second and third faces and forming electrical interconnections between element contacts of the second microelectronic element and the third microelectronic element.

In some implementations, the nanoscale conductors are comprised of a single conductive material (e.g., gold, silver, copper, titanium, an alloy, a conductive carbon, etc.). In one implementation, each nanoscale conductor of the plurality of nanoscale conductors comprises multiple segments of material along a length of the nanoscale conductor. Adjacent segments of the multiple segments comprise different compositions of conductive material. For example, each nanoscale conductor segment may comprise a different conductive layer. In various examples, the segments of the nanoscale conductors may be comprised of copper, gold, nickel, solder, tin, indium, alloys of the same, or various other conductive materials or compositions.

Various implementations and arrangements are discussed with reference to electrical and electronics components and varied carriers. While specific components (i.e., integrated circuit (IC) chip dies, wafers, substrates, printed circuit boards (PCB), discrete components, etc.) are mentioned, this is not intended to be limiting, and is for ease of discussion and illustrative convenience. The techniques and devices discussed are applicable to any type or number of packages, packaged circuits or components, circuits (e.g., integrated circuits (IC), mixed circuits, ASICS, memory devices, processors, etc.), electrical components (e.g., sensors, transistors, diodes, etc.), groups of components, carrier structures (e.g., wafers, substrates, panels, boards, PCBs, etc.), and the like. Each of these components, circuits, chips, structures, and the like, can be generically referred to as a "microelectronic element." Further, references to a specific component are also applicable to other types of microelectronic elements, unless specified.

Implementations are explained in more detail below using a plurality of examples. Although various implementations and examples are discussed here and below, further implementations and examples may be possible by combining the features and elements of individual implementations and examples.

Example Nanoscale Interconnect Array

FIG. 1 illustrates an example microelectronic assembly 100 comprising a three-dimensional stack of microelectronic elements (e.g., dies 102) and a plurality of interconnect arrays 104, where an interconnect array 104 is disposed between adjacent dies 102, according to an implementation. Each interconnect array 104 includes nanoscale-pitch conductors within an insulating layer, and provides electrical interconnection between terminals and contacts of adjacent dies 102. In some embodiments, a die 102 may have interconnect terminals on a top side and a bottom side of the die 102, particularly when the die 102 is disposed in the middle of the microelectronic assembly 100 stack.

In various implementations, an interconnect array 104 may be universally applied (as a unified layer) to a variety of dies 102 (or other microelectronic elements) since the nanoscale conductors provide electrical connection without requiring the terminals and contacts on the adjacent dies 102 to be perfectly aligned, so long as the terminals and connections substantially face each other on the respective adjacent dies 102. For example, a first pair of adjacent dies 102 may include a different arrangement of contact terminals than a second pair of adjacent dies 102, but a first interconnect array 104 disposed between the first pair of adjacent dies 102 and a second interconnect array 104 disposed between the second pair of adjacent dies 102 can have a same physical arrangement of nanoscale conductors 212.

Figure 2:
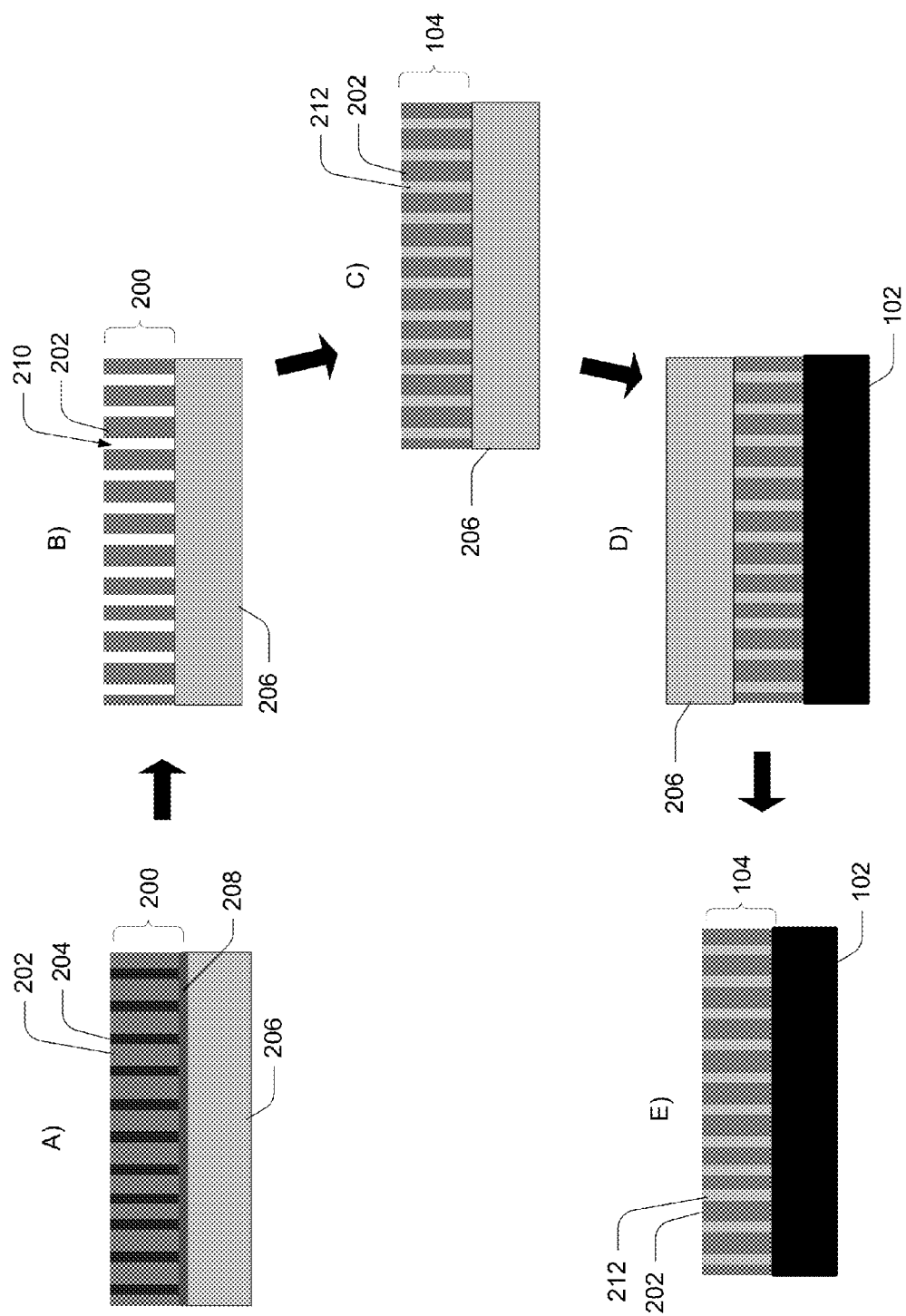
FIGS. 2 and 3 show example process steps for forming an interconnect array, according to example embodiments.

FIG. 2 illustrates example process steps for forming an interconnect array 104, according to an example embodiment. An insulating diblock copolymer layer 200 (comprising two different polymers 202 and 204) is formed on a metal substrate 206 (for example). In some implementations, a thin layer 208 may be formed on the metal substrate 206, with the diblock copolymer layer 200 formed on the layer 208. The thin layer 208 may comprise a conductive layer such as titanium, chromium, aluminum, gold, or the like. In some embodiments, the thin layer 208 provides a catalyst or a seed layer for growing or forming nanoscale conductors 212 within the insulting layer 200 (as described below).

The diblock copolymer layer 200 forms a nanoscale matrix pattern by self-assembly, due to the different polymers (202, 204) used in the layer 200. For instance, in an implementation, the polymers comprise polystyrene (202) and poly(methyl methacrylate) (PMMA) (204), or similar materials. The nanoscale matrix pattern that is formed has nanoscale spacing between the two polymers (202, 204) once self-assembled. The self-assembly of the diblock copolymer layer 200 can be preferable to lithography (for example) for forming the nanoscale pattern, due to cost savings.

One of the polymers (PMMA 204, for example) is removed from the layer 200, revealing nanoscale holes 210 in the insulating layer 200. Various methods may be used to remove the polymer 204. In one example, the layer 200 is exposed to UV radiation (e.g., 25J/square cm), and the polymer 204 is dissolved. The polymer 204 may be rinsed away with a developer or similar chemical rinse. For instance, in the above example, the UV exposure degrades PMMA 204 domains and simultaneously cross-links the polystyrene 202 matrix such that the degraded PMMA 204 can be removed by rinsing with acetic acid, or the like, leaving nanoscale holes 210 behind (the polystyrene 202 is a solid (glassy) state at room temperature).

The nanoscale holes 210 are filled or coated with a conductive material to form nanoscale conductors 212 in the holes 210. In various implementations, the nanoscale conductors 212 may be formed via bottom-up plating, pulsed electrodeposition, chemical vapor deposition (CVD), electroless plating (in solution or vapor phase), or the like. Alternately, the nanoscale conductors 212 may be grown chemically in solution (using the catalyst or seed layer 208 or a metallic substrate 206 as a seed, for example). In either case, the resulting structure is the interconnect array layer 104, comprising an array of nanoscale conductors 212 within an insulating polymer 202. If desired, the exposed surface of the layer 104 may be polished or etched to prepare it for transfer to a die 102.

In an implementation, the insulating polymer 202 is also an adhesive, allowing the interconnect array layer 104 to be joined to a wafer or stacked die 102, adhering (mechanically coupling) the interconnect array layer 104 to the die 102. In the implementation, the nanoscale conductors 212 make contact with terminals and connections on the face of the joined die 102. In an embodiment, the interconnect array layer 104 is joined to the die 102 using a film transfer, or like process, where the interconnect array layer 104 is transferred as a unified single layer. In an implementation, the metal substrate 206 is removed from the opposite surface of the interconnect array layer 104, by peeling, polishing, etching, or the like. This prepares the opposite surface to be joined to another die 102, if desired, forming the microelectronic assembly 100, as shown in FIG. 1.

Figure 3:
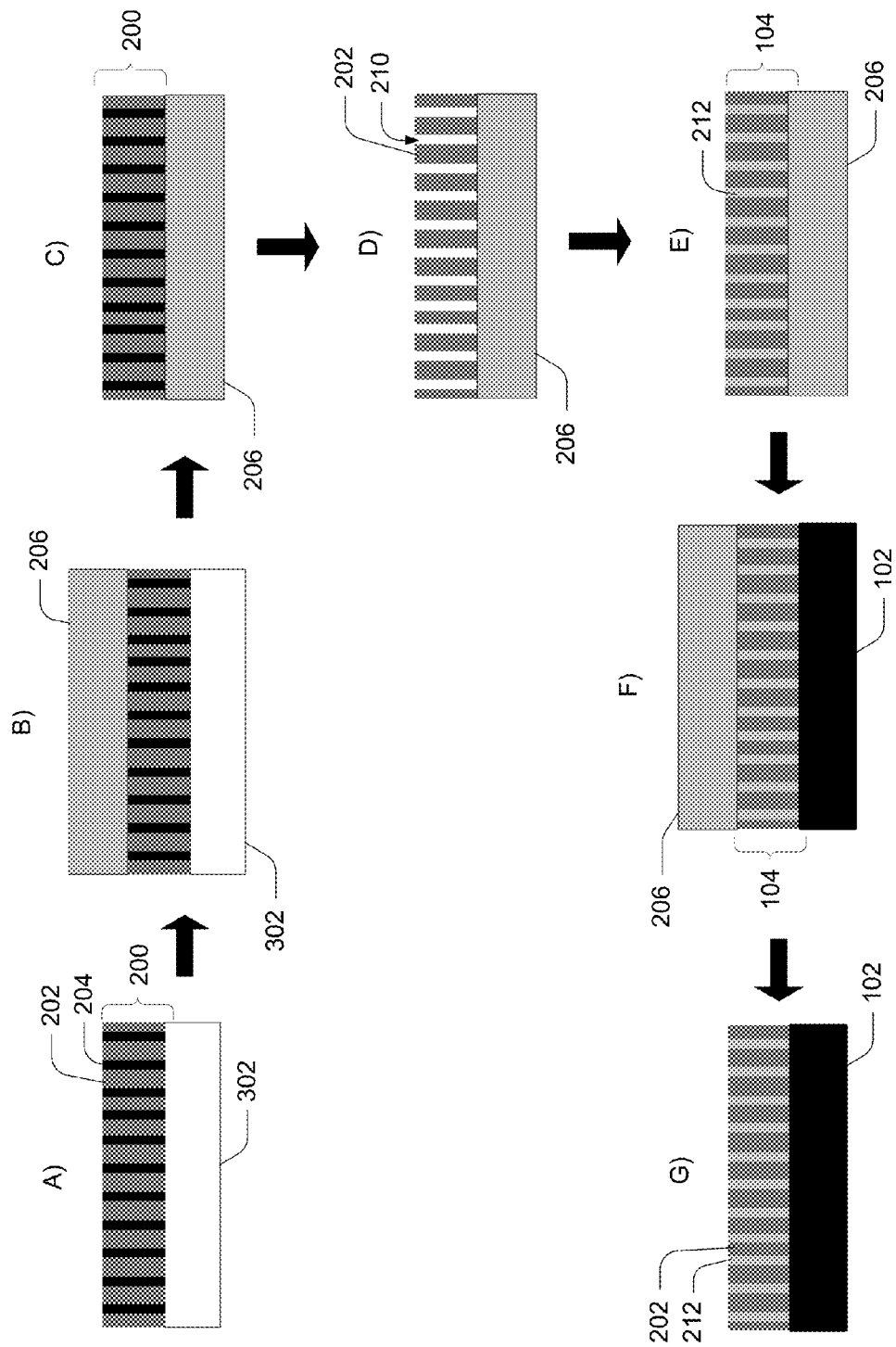

FIG. 3 illustrates alternate example process steps for forming an interconnect array 104, according to an embodiment. As shown in FIG. 3, the diblock copolymer layer 200 can be formed on an insulator or semiconductor layer 302 (e.g., silicon-dioxide, silicon, etc.). Once formed, the diblock copolymer layer 200 can be transferred (by film transfer, for example) to a metal substrate 206, and the wafer 302 removed. The process steps follow as described with reference to FIG. 2 at this point.

Figure 4:
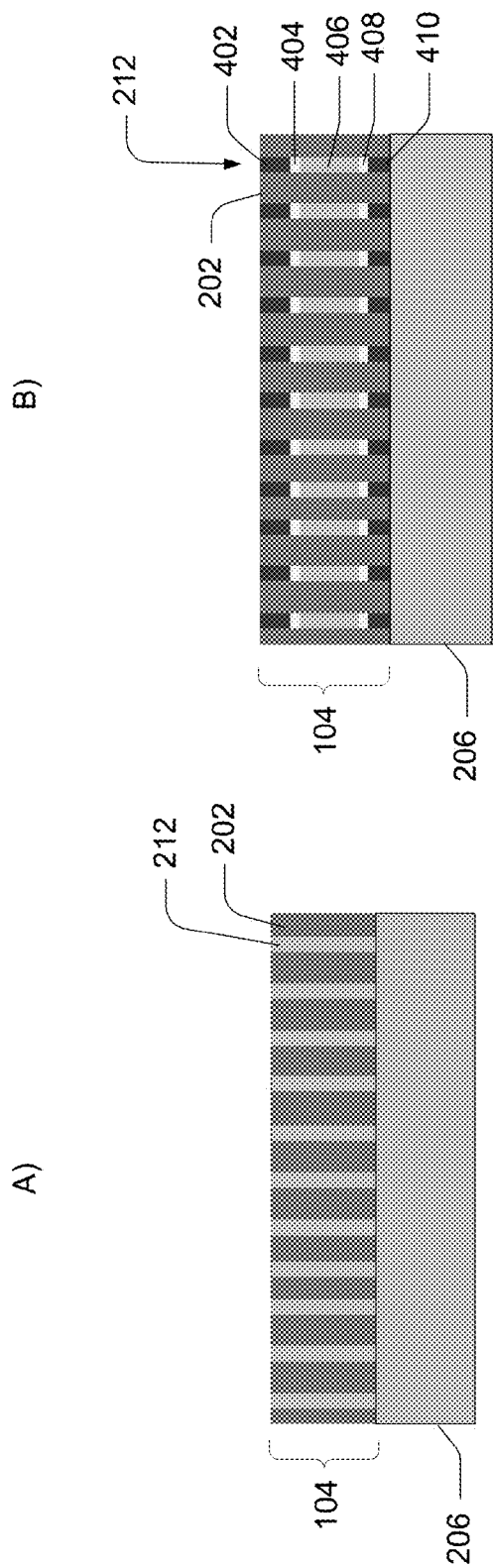
FIG. 4 is an illustration of two example interconnect arrays, a first having nanoscale conductors comprised of a single material, and a second having nanoscale conductors comprised of multiple materials, according to example embodiments.

FIG. 4 is an illustration of two example interconnect arrays 104, a first (shown at (A)) having nanoscale conductors 212 comprised of a single conductive material, and a second (shown at (B)) having nanoscale conductors 212 comprised of multiple conductive materials, according to example embodiments. In various implementations, the nanoscale conductors 212 are formed to have nanometer-scale dimensions and are spaced in the arrays 104 with nanometer-scale spacing (e.g., tens to hundreds of nanometers in diameter and in pitch). In one example, a nanoscale conductor 212 with a diameter of 90 nm and length of approximately 2 um has a resistivity (at room temperature) of $6.3 \times 10^{-8}$ $\Omega \cdot m$. In other examples, nanoscale conductors 212 have a greater or lesser resistivity.

As shown in FIG. 4 at (B), nanoscale conductors 212 can be formed to include multiple segments (402-410) along a length of each nanoscale conductor 212. In various embodiments, adjacent segments of the multiple segments (402-410) can comprise a different conductive material. For instance, each nanoscale conductor 212 can include one or more segments (e.g., 406) comprising copper or copper alloy, one or more segments (e.g., 404 and 408) comprising nickel or nickel alloy, one or more segments comprising tin or tin alloy (e.g., 402 and 410), and so forth. In an example, a segment (e.g., 402 and 410) at the end of each nanoscale conductor 212 comprises a solder or solder-type material. This can be advantageous for interconnecting contact pads of very fine-pitch on adjacent dies 102 in a 3D stack (e.g., assembly 100) free from the pitch limit on conventional solder flip-chip assembly, since it provides nanowire solder already, and does not require solder at contact pads on adjacent dies 102.

Figure 5:
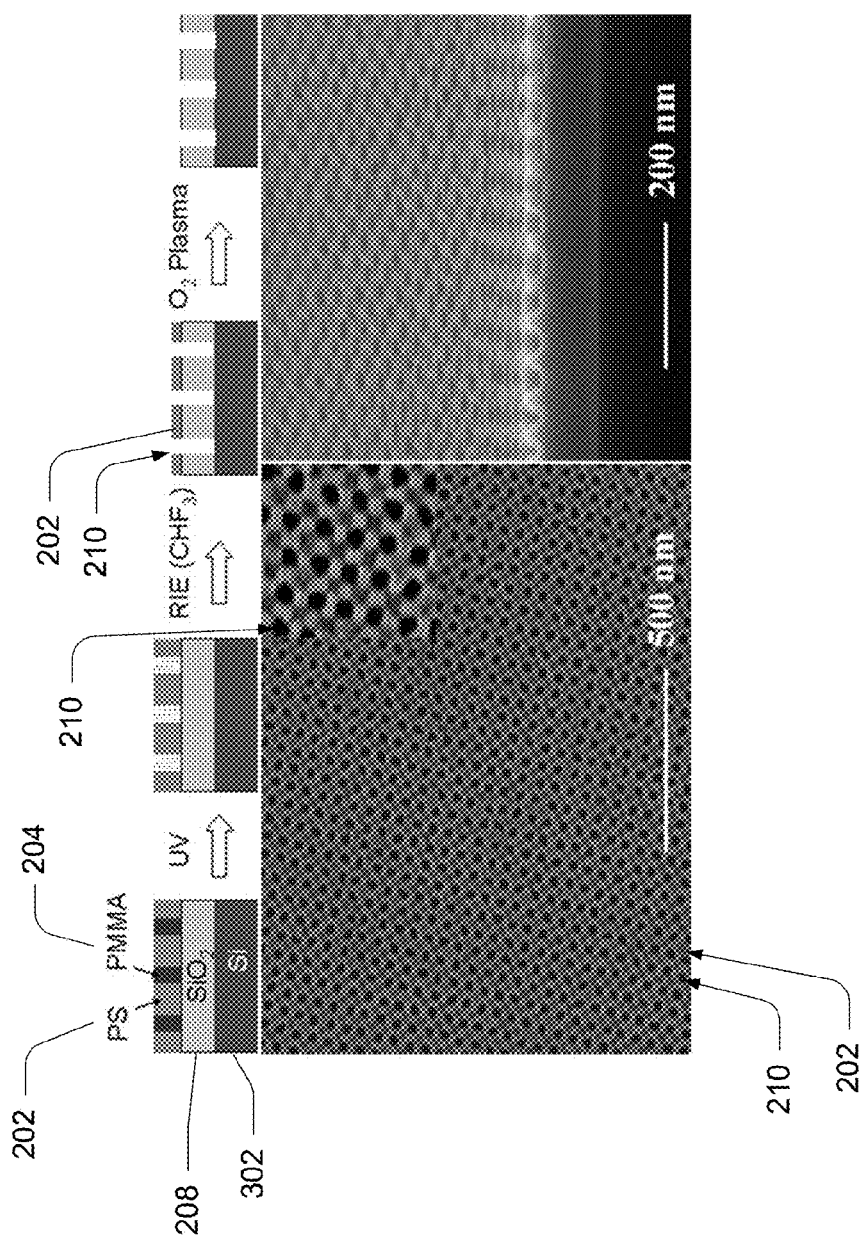
FIG. 5 shows an example of forming a nanoscale array of holes, according to an embodiment.

FIG. 5 shows examples of forming nanoscale matrix arrays of holes 210 surrounded by insulating polymer 202, using a self-assembled diblock copolymer process, according to an embodiment. As shown, self-assembled matrices having a pitch of 72 nm and 620 nm were achieved in these examples. (Note the scales at the bottom of the diagrams.) In other examples, self-assembled matrices having a lesser or a greater pitch are also possible using the disclosed techniques.

Figure 6:
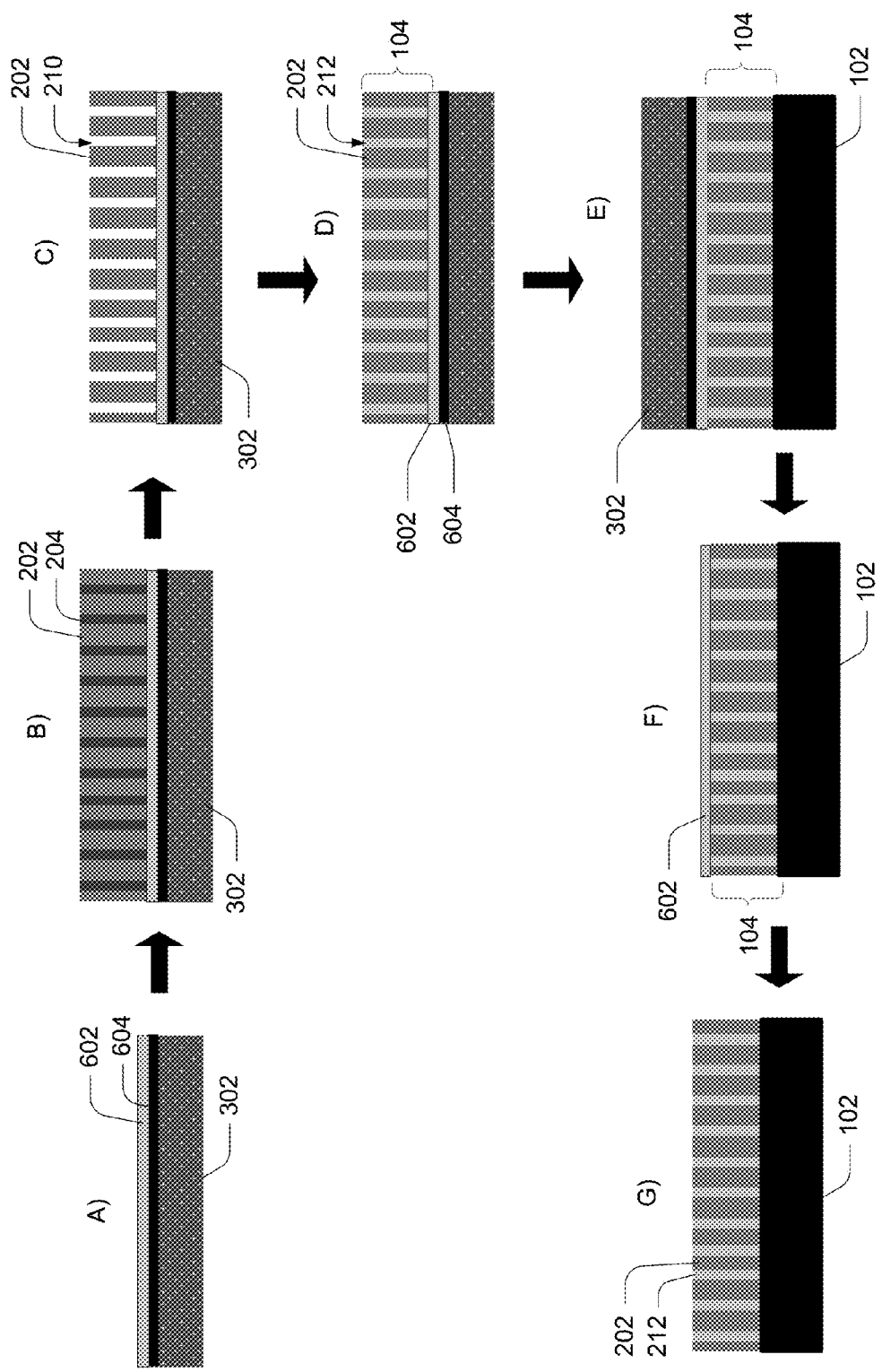
FIG. 6 shows an example of process steps for forming an interconnect array, according to an embodiment.

FIG. 6 shows another example of process steps for forming an interconnect array 104, according to an embodiment. In the embodiment, the diblock copolymer layer 200 is formed on a substrate 302 (which may comprise plastic, glass, metal, etc.). In one implementation, one or more layers (602, 604) are added to the substrate 302, with the diblock copolymer layer 200 formed on the one or more layers (602, 604). In an implementation, one layer (602) comprises an adhesive, and another layer (604) comprises a metal (such as sputtered aluminum, etc.). The metal layer 604 can assist in the growth or formation of the nanoscale conductors 212 (e.g., catalyst or seed layer, etc.), and the adhesive layer 602 can facilitate the removal of the substrate 302 after transfer of the interconnect array 104 to a wafer or die 102. The adhesive layer 602 may be removed using a knife edge, UV exposure, heat, or the like. The metal layer 604 can be removed using a dry etch with various gasses (Cl2, SiCl4, Cl2/BCl3, Cl2/HBr, etc.), for example.

Figure 7:
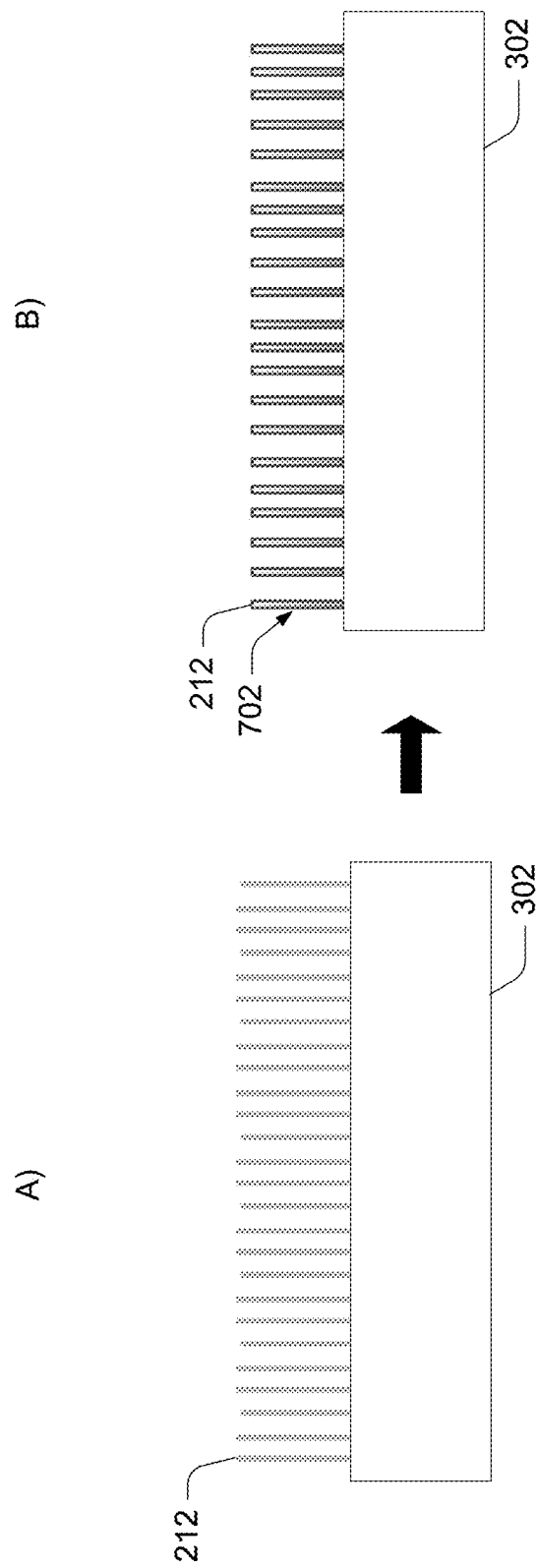
FIG. 7 is an illustration of two example sets of nanoscale conductors, a first set grown from a catalyst layer, and a second set having a coating on the nanoscale conductors to achieve a desired property, according to example embodiments.

FIG. 7 is an illustration of two example sets of nanoscale conductors 212, a first set (shown at (A)) grown from a catalyst layer, and a second set (shown at (B)) having a coating on the nanoscale conductors 212 to achieve a desired property, according to example embodiments. It is assumed that the nanoscale conductors 212 shown in FIG. 7 are disposed within an insulating layer (such as the polymer 202, for example) to form an interconnect array 104, however, the insulating layer is not shown in FIG. 7 for clarity. In the examples shown in FIG. 7, the substrate 302 represents a template substrate, optionally coated with a catalyst layer (such as layer 208 or layer 602, for example) for growing or forming the nanoscale conductors 212.

In various embodiments, as shown in FIG. 7, the nanoscale conductors 212 can be coated with a selected material to achieve desired properties. For example, conductive nanoscale conductors 212 can be coated with an insulating thin film or coating to isolate one nanoscale conductor 212 from another, if desired. In another example, conductive nanoscale conductors 212 can be coated with another conductive material to improve conductivity, if desired. Further, nanoscale wires comprised of a non-conductive material can be coated with a conductive material to provide conductive nanoscale wires (i.e., nanoscale conductors 212).

Figure 8:
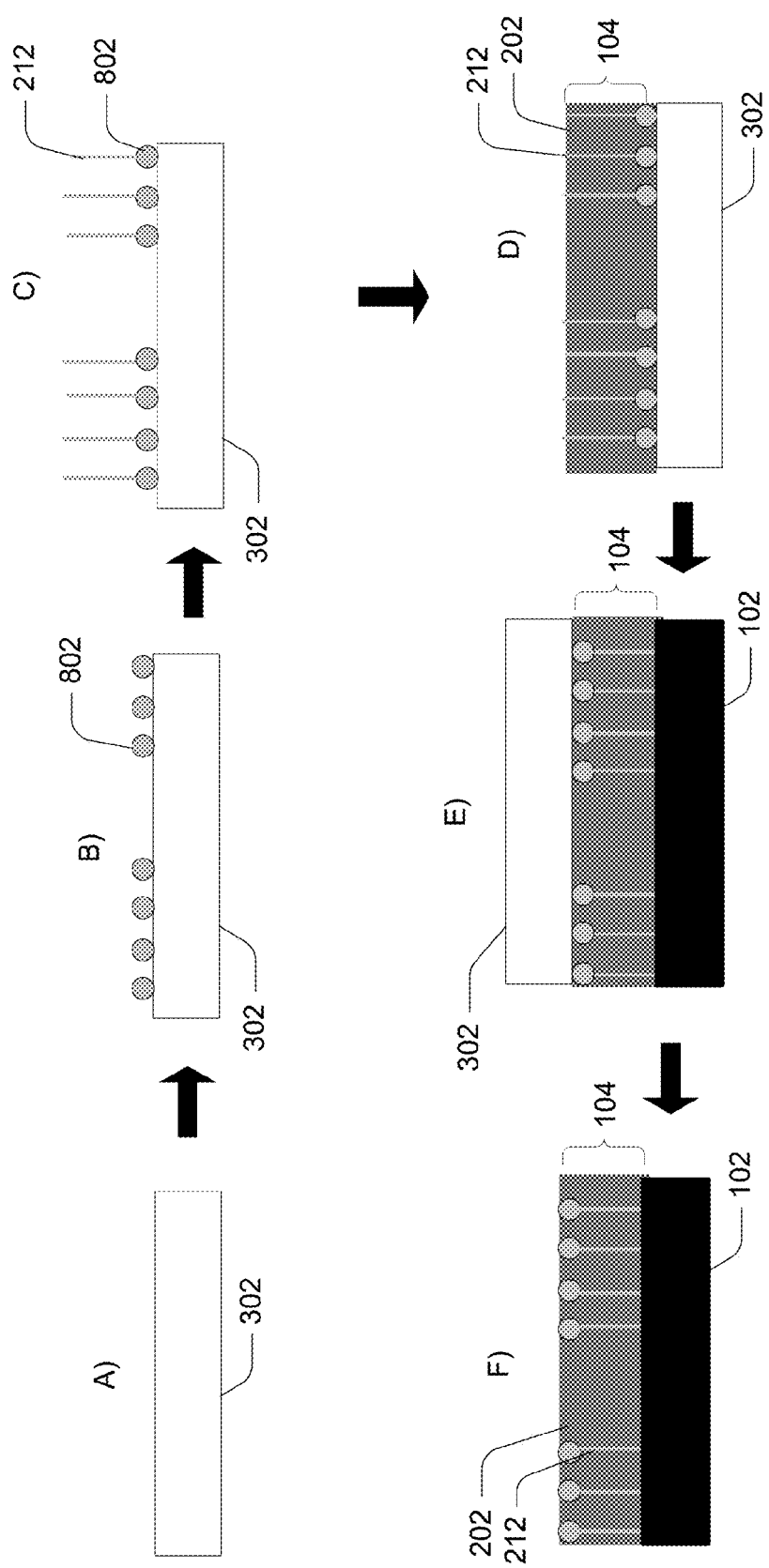
FIGS. 8-10 show example process steps for forming nanoscale conductors and interconnect arrays, according to example embodiments.
Figure 9:
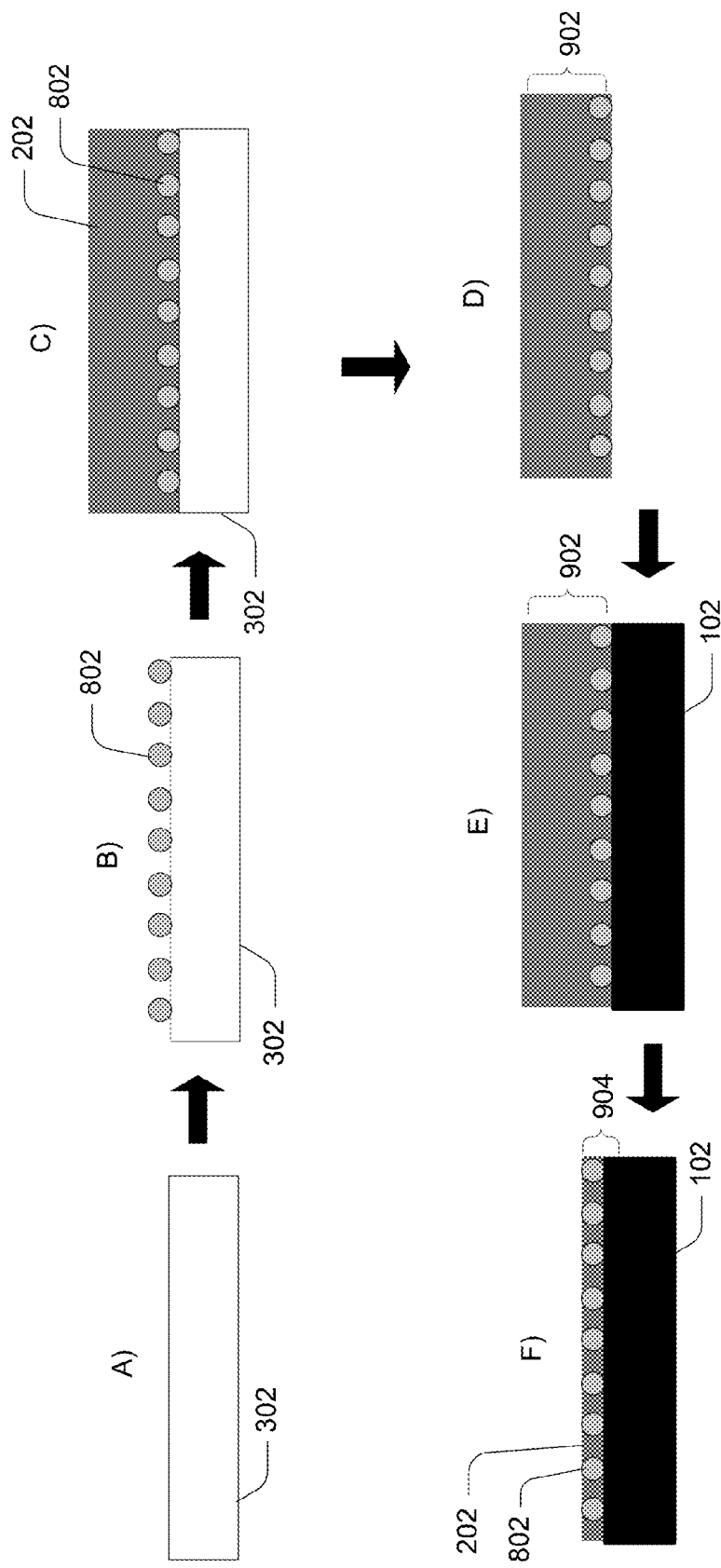
Figure 10:
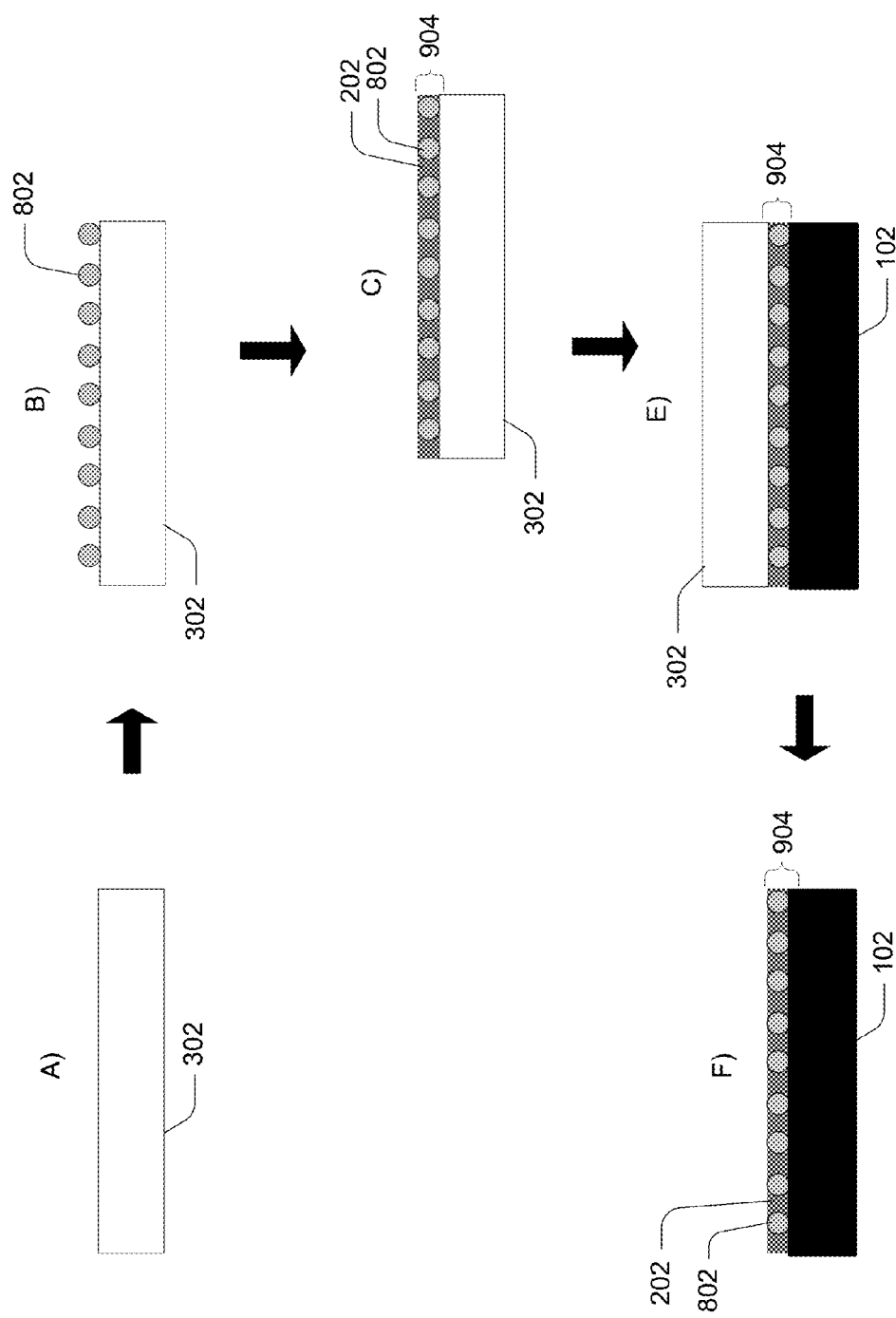

In alternate embodiments, nanoscale conductors 212 can be grown from conductive nanoparticles 802, for example. FIGS. 8-10 show example process steps for forming nanoscale conductors 212 and an interconnect array 104, using nanoparticles 802, according to example embodiments. In various implementations, the nanoparticles 802 can be comprised of conductive catalyst materials, such as gold or other similar metals.

Referring to FIG. 8, the nanoparticles 802 (catalyst particles) are disposed on a template substrate 302 (optionally on desired areas of the template only). Nanoscale conductors 212 can be grown from the nanoparticles 802, in a pattern or an array, as described above. An insulating layer, such as a polymer layer 202 is added to the pattern or array of nanoscale conductors 212, forming an interconnect array 104. The exposed surface of the interconnect array 104 may be polished, and the interconnect array 104 is joined to a wafer or die 102, as described above. The template substrate 302 can be removed by mechanical peel, grinding, etching, laser liftoff, or other process.

Referring to FIG. 9, the nanoparticles 802 can be disposed on a template substrate 302 using a template assisted self-assembly process. For example, grooves and/or pits (optionally in a desired pattern or arrangement) may be arranged on the exposed surface of the substrate 302, allowing the nanoparticles 802 to settle into the grooves and/or pits. An insulating layer 202 (e.g., adhesive polymer coating, etc.) is added to the arrangement of nanoparticles 802, forming an intermediate layer 902 on the substrate 302. Rather than growing nanowires from the nanoparticles 802, the intermediate layer 902 is transferred to a wafer or die 102 from the substrate 302, as a stand-alone layer by film transfer, for example. The intermediate layer 902 is etched to expose the other side of the nanoparticles 802, forming an interconnect array 904, similar to the interconnect array 104, but using nanoparticles 802 instead of nanowires for nanoscale conductors 212.

Referring to FIG. 10, the process of FIG. 9 may be modified such that the insulating layer 202 is a thin layer, exposing the nanoparticles 802 after its application. This forms the interconnect array 904 on the substrate 302, which substrate 302 is removed (via mechanical peel, grinding, etching, laser liftoff, etc.) after being used to transfer the interconnect array 904 to the wafer or die 102.

Unless otherwise specified, alternative components to those specifically mentioned may be used to implement the techniques described herein. In various implementations, the techniques described herein may be applied to stacks or groups of stacks of packaged microelectronic components 102, or the like.

Figure 11:
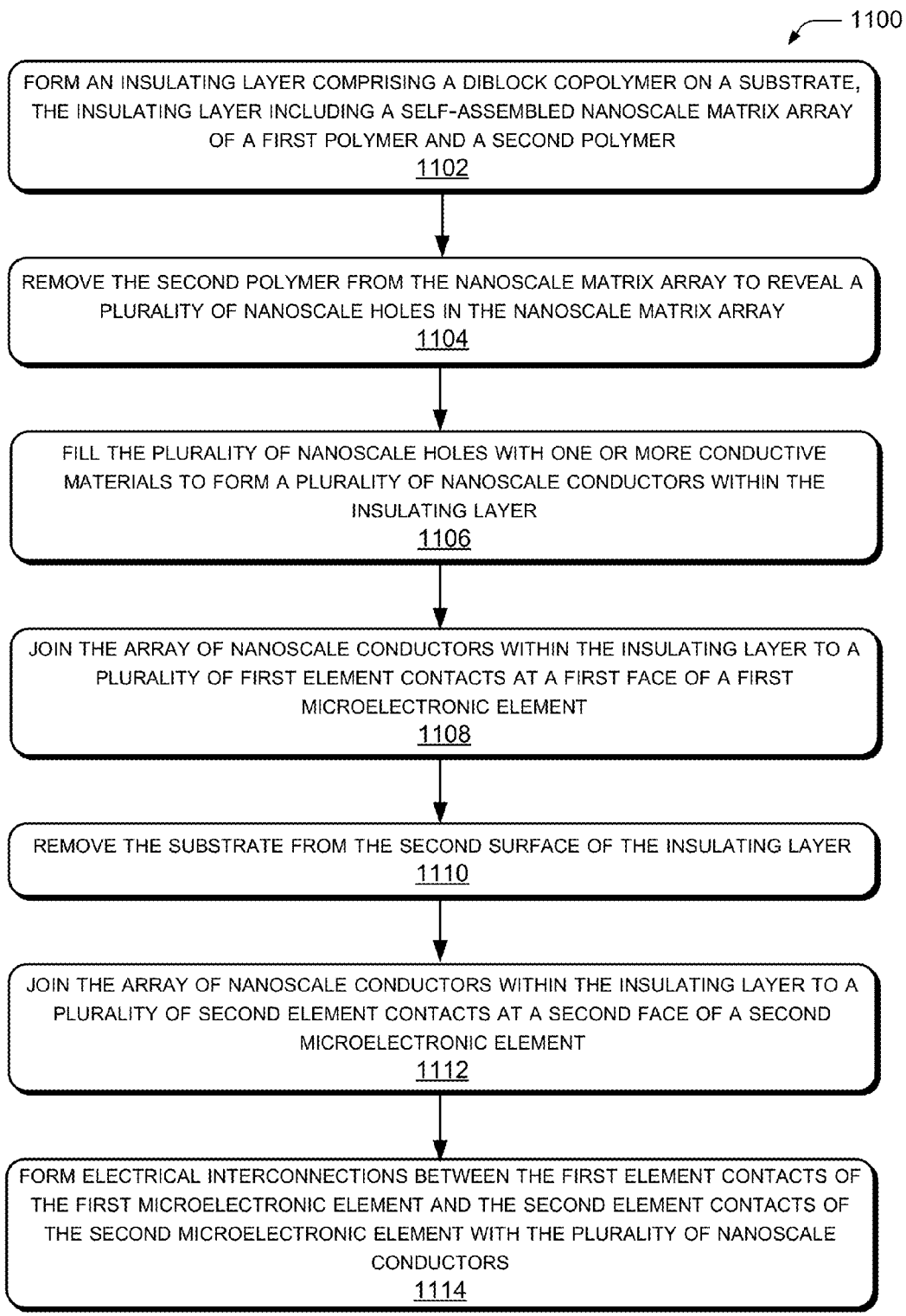
FIGS. 11 and 12 are flow diagrams illustrating example processes for forming a three-dimensional stack of dies having an interconnect array between adjacent dies of the stack, according to example implementations.
Figure 12:
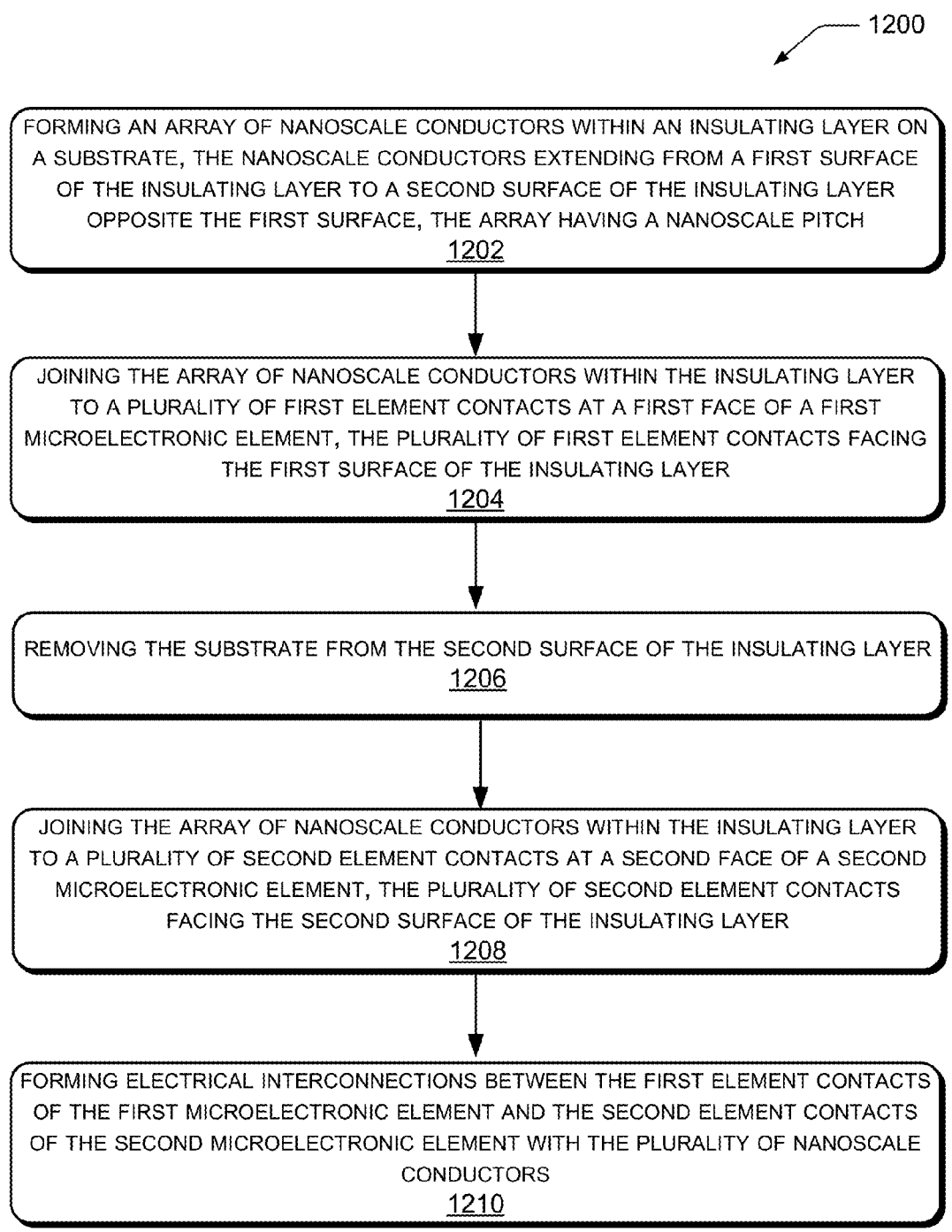

FIGS. 11 and 12 are flow diagrams illustrating example processes 1100 and 1200 for forming a microelectronic assembly 100 comprising a three-dimensional stack of microelectronic elements (such as dies 102, for example) including an interconnect array 104, according to various implementations. The use of the text-based flow diagrams of FIGS. 11 and 12 to illustrate the processes described are examples that are not intended to be limiting. Further, FIGS. 1-10 and their respective discussions also illustrate example processes for forming a microelectronic assembly 100 and/or an interconnect array 104, in the form of graphics-based flow diagrams. Each of the processes described with respect to FIGS. 1-12 also describe a corresponding apparatus, structure, system, or the like. The blocks of FIGS. 11 and 12 have reference to the arrangements shown at FIGS. 1-10.

Referring to FIG. 11, at 1102, the process includes forming an insulating layer comprising a diblock copolymer on a substrate, the insulating layer including a self-assembled nanoscale matrix array of a first polymer and a second polymer. In an example, the process includes forming the diblock polymer insulating layer on a semiconductor wafer and transferring the insulating layer to a metallic substrate to form the array of nanoscale conductors. At 1104, the process includes removing the second polymer from the nanoscale matrix array to reveal a plurality of nanoscale holes in the nanoscale matrix array. For example, this can include exposing the diblock copolymer to ultra-violet radiation, dissolving the second polymer, and chemically removing the second polymer to reveal the plurality of nanoscale holes.

At 1106, the process includes filling the plurality of nanoscale holes with one or more conductive materials to form a plurality of nanoscale conductors within the insulating layer, the nanoscale conductors extending from a first surface of the insulating layer to a second surface of the insulating layer opposite the first surface. In an embodiment, the process includes filling the plurality of nanoscale holes in the nanoscale matrix array with one or more conductive materials using electroless deposition in solution or vapor phase, or using a pulsed electrodeposition. chemically growing the plurality of nanoscale conductors within the plurality of nanoscale holes in the nanoscale matrix array in a solution, using catalyst metallic particles as seeds to grow the nanoscale conductors or using a metallic layer or metallic substrate as a seed. In an implementation, the process includes forming the plurality of nanoscale conductors to include multiple segments along a length of each nanoscale conductor, wherein adjacent segments of the multiple segments comprise a different conductive material. In one example, this includes forming a segment of each nanoscale conductor nearest to the first or second surface of the insulating layer to comprise a solder or solder-type material.

At 1108, the process includes joining the array of nanoscale conductors within the insulating layer to a plurality of first element contacts at a first face of a first microelectronic element, the plurality of first element contacts facing the first surface of the insulating layer. At 1110, the process includes removing the substrate from the second surface of the insulating layer. At 1112, the process includes joining the array of nanoscale conductors within the insulating layer to a plurality of second element contacts at a second face of a second microelectronic element, the plurality of second element contacts facing the second surface of the insulating layer. At 1114, the process includes forming electrical interconnections between the first element contacts of the first microelectronic element and the second element contacts of the second microelectronic element with the plurality of nanoscale conductors.

Referring to FIG. 12, at 1202, the process includes forming an array of nanoscale conductors within an insulating layer on a substrate, the nanoscale conductors extending from a first surface of the insulating layer to a second surface of the insulating layer opposite the first surface, the array having a nanoscale pitch. In an implementation, the process includes forming the nanoscale conductors of a first material and coating the nanoscale conductors with a second material to obtain desired properties, wherein at least the first material or the second material is an electrically conductive material. In one embodiment, the other of the first material and the second material is an electrically non-conductive material.

At 1204, the process includes joining the array of nanoscale conductors within the insulating layer to a plurality of first element contacts at a first face of a first microelectronic element, the plurality of first element contacts facing the first surface of the insulating layer, including applying the array of nanoscale conductors and the insulating layer in a single application to the first microelectronic element without regard to a specific alignment of the nanoscale conductors to the first element contacts. At 1206, the process includes removing the substrate from the second surface of the insulating layer.

At 1208, the process includes joining the array of nanoscale conductors within the insulating layer to a plurality of second element contacts at a second face of a second microelectronic element, the plurality of second element contacts facing the second surface of the insulating layer. In an embodiment, this includes bonding the second microelectronic element to the array of nanoscale conductors within the insulating layer without regard to a specific alignment of the nanoscale conductors to the second element contacts, including mechanically coupling the first microelectronic element to the second microelectronic element with the insulating layer, where the insulating layer comprises an adhesive.

At 1210, the process includes forming electrical interconnections between the first element contacts of the first microelectronic element and the second element contacts of the second microelectronic element with the plurality of nanoscale conductors.

Different configurations of a microelectronic assembly 100 or an interconnect array 104 than those illustrated or discussed may be possible with different implementations, and are within the scope of the disclosure. The variations may have fewer elements than illustrated in the examples shown in FIGS. 1-12, or they may have more or alternative elements than those shown.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A microelectronic assembly, comprising:
   an insulating layer having a first surface and a second surface opposite the first surface;
   a plurality of nanoscale conductors disposed in an array within the insulating layer, the plurality of nanoscale conductors extending from the first surface to the second surface of the insulating layer, the array having a nanoscale pitch;
   a first microelectronic element having a first face and a plurality of first element contacts at the first face, the first element contacts facing and joined to the plurality of nanoscale conductors at the first surface of the insulating layer; and
   a second microelectronic element having a second face and a plurality of second element contacts at the second face, the second element contacts facing and joined to the plurality of nanoscale conductors at the second surface of the insulating layer,
   wherein the plurality of nanoscale conductors disposed in the array form electrical interconnections between the first element contacts of the first microelectronic element and the second element contacts of the second microelectronic element, and wherein the insulating layer comprises an adhesive adapted to mechanically couple the first microelectronic element to the first surface of the insulating layer and to mechanically couple the second microelectronic element to the second surface of the insulating layer, and
   wherein the plurality of nanoscale conductors are arranged without regard to a specific alignment of the plurality of nanoscale conductors to either the plurality of first element contacts or the plurality of second element contacts.

2. The microelectronic assembly of claim 1, wherein the plurality of nanoscale conductors each comprise a non-conductive material coated with a conductive material adapted to electrically couple element contacts of the first microelectronic element to element contacts of the second microelectronic element.

3. The microelectronic assembly of claim 1, wherein the insulating layer is a first insulating layer, the microelectronic assembly further comprising a second insulating layer extending from the second microelectronic element at a face opposite the second face, to a third face of a third microelectronic element, the second insulating layer including a second plurality of nanoscale conductors disposed in a nanoscale pitch array within the second insulating layer, the second plurality of nanoscale conductors extending from the face opposite the second face to the third face and forming electrical interconnections between element contacts of the second microelectronic element and the third microelectronic element.

4. The microelectronic assembly of claim 1, wherein the insulating layer comprises a single layer bounded by the first surface and the second surface.

5. The microelectronic assembly of claim 1, wherein a pitch of the plurality of first element contacts or the plurality of second element contacts is at least one micrometer, and wherein a pitch of each of the plurality of nanoscale conductors is less than the pitch of any of the plurality of first element contacts or the plurality of second element contacts.

6. A microelectronic assembly, comprising:
an insulating layer having a first surface and a second surface opposite the first surface;
a plurality of nanoscale conductors disposed in an array within the insulating layer, the plurality of nanoscale conductors extending from the first surface to the second surface of the insulating layer, the array having a nanoscale pitch;
one or more first microelectronic elements having a first face and a plurality of first element contacts at the first face, the first element contacts facing and joined to the plurality of nanoscale conductors at the first surface of the insulating layer; and
one or more second microelectronic elements having a second face and a plurality of second element contacts at the second face, the second element contacts facing and joined to the plurality of nanoscale conductors at the second surface of the insulating layer,
wherein the plurality of nanoscale conductors disposed in the array form electrical interconnections between the plurality of first element contacts of the one or more first microelectronic elements and the plurality of second element contacts of the one or more second microelectronic elements, and wherein the plurality of nanoscale conductors are arranged without regard to a specific alignment of the plurality of nanoscale conductors to either the plurality of first element contacts or the plurality of second element contacts.

7. A microelectronic assembly, comprising:
a microelectronic interconnect array, comprising:
an insulating layer having a first surface and a second surface opposite the first surface; and
a plurality of nanoscale conductors disposed in a nanoscale pitch array within the insulating layer, the plurality of nanoscale conductors extending from the first surface to the second surface of the insulating layer, each nanoscale conductor of the plurality of nanoscale conductors comprising multiple segments along a length of the nanoscale conductor, adjacent segments of the multiple segments comprising different compositions of conductive material; and
a first microelectronic element and
a second microelectronic element, and wherein the plurality of nanoscale conductors form electrical interconnections between first electrical contacts of the first microelectronic element and second electrical contacts of the second microelectronic element, the microelectronic interconnect array disposed between the first and second microelectronic elements and the electrical contacts of the first and second microelectronic elements face the first and second surfaces of the insulating layer, respectively, the plurality of nanoscale conductors are arranged without regard to a specific alignment of the plurality of nanoscale conductors to either the first electrical contacts or the second electrical contacts.

8. The microelectronic assembly of claim 7, further comprising a third microelectronic element having a plurality of third electrical contacts, the third electrical contacts facing and joined to the plurality of nanoscale conductors at the first surface or the second surface of the insulating layer, and wherein the plurality of nanoscale conductors form electrical interconnections between the third electrical contacts of the third microelectronic element and the second electrical contacts of the second microelectronic element or the first electrical contacts of the first microelectronic element, respectively.

9. The microelectronic assembly of claim 7, wherein the insulating layer comprises an adhesive polymer material mechanically coupling the first microelectronic element to the second microelectronic element.

10. The microelectronic assembly of claim 7, wherein each nanoscale conductor of the plurality of nanoscale conductors includes one or more segments comprising copper or copper alloy, one or more segments comprising nickel or nickel alloy, and one or more segments comprising tin or tin alloy.

11. A system comprising one or more microelectronic interconnect arrays according to claim 7, and a three-dimensional stack of multiple microelectronic elements, a microelectronic interconnect array of the one or more microelectronic interconnect arrays disposed between adjacent microelectronic elements of the stack, the microelectronic interconnect array forming an electrical interconnection between contact terminals of the adjacent microelectronic elements of the stack.

12. The system as claimed in claim 11, wherein a first pair of adjacent microelectronic elements includes a different arrangement of contact terminals than a second pair of adjacent microelectronic elements, and wherein a microelectronic interconnect array disposed between the first pair of adjacent microelectronic elements and another microelectronic interconnect array disposed between the second pair of adjacent microelectronic elements have a same physical arrangement of nanoscale conductors.

* * * * *